United States Patent
Yasuda et al.

(10) Patent No.: US 8,012,884 B2
(45) Date of Patent: Sep. 6, 2011

(54) SEMICONDUCTOR DEVICE MANUFACTURING METHOD AND SEMICONDUCTOR DEVICE MANUFACTURING APPARATUS

(75) Inventors: Satoshi Yasuda, Toyama (JP); Shin-ichi Imai, Osaka (JP)

(73) Assignee: Panasonic Corporation, Osaka (JP)

( * ) Notice: Subject to any disclaimer, the term of this patent is extended or adjusted under 35 U.S.C. 154(b) by 242 days.

(21) Appl. No.: 12/493,818

(22) Filed: Jun. 29, 2009

(65) Prior Publication Data
US 2010/0003831 A1    Jan. 7, 2010

(30) Foreign Application Priority Data
Jul. 2, 2008    (JP) ................................. 2008-173539

(51) Int. Cl.
*H01L 21/31* (2006.01)
*C23C 16/00* (2006.01)
(52) U.S. Cl. ......... 438/758; 438/778; 438/680; 118/724
(58) Field of Classification Search .................. 438/584, 438/585, 679, 680, 681, 758, 778, 787, 788; 118/666, 667, 724, 725
See application file for complete search history.

(56) References Cited

U.S. PATENT DOCUMENTS

| | | | | |
|---|---|---|---|---|
| 5,714,757 A * | 2/1998 | Itabashi et al. | ................. | 850/63 |
| 5,946,543 A * | 8/1999 | Kimura et al. | ................. | 438/14 |
| 6,855,916 B1 * | 2/2005 | Matthews et al. | ............ | 118/724 |
| 6,855,928 B2 * | 2/2005 | Marsh | ............................. | 850/43 |
| 7,049,588 B2 * | 5/2006 | De Chambost et al. | ...... | 250/310 |
| 7,202,475 B1 * | 4/2007 | Testoni | ........................ | 250/310 |
| 7,871,932 B2 * | 1/2011 | Yasuda | ........................ | 438/689 |
| 2005/0252884 A1 * | 11/2005 | Lam et al. | ........................ | 216/59 |
| 2007/0095799 A1 | 5/2007 | Matsuzawa et al. | | |
| 2008/0020497 A1 * | 1/2008 | Miyazaki | ........................ | 438/14 |
| 2009/0121152 A1 * | 5/2009 | Obara et al. | ............ | 250/442.11 |

FOREIGN PATENT DOCUMENTS

JP    2007-059945    3/2007

* cited by examiner

*Primary Examiner* — Kevin M Picardat
(74) *Attorney, Agent, or Firm* — McDermott Will & Emery LLP

(57) ABSTRACT

A predicted film formation rate value is computed based on a film formation rate prediction formula obtained in advance and apparatus parameters obtained during a previously-performed film formation process. A processing time required for an amount of film formed on a wafer to reach a predetermined target film thickness is computed based on the computed predicted film formation rate value and the target film thickness. Then, according to the computed processing time, a film-formation process is performed on wafers. In addition, it is determined whether the computed predicted film formation rate value is within a predetermined range, and only when it is determined to be within the predetermined range, the film formation process may be performed.

18 Claims, 8 Drawing Sheets

Fig. 3A
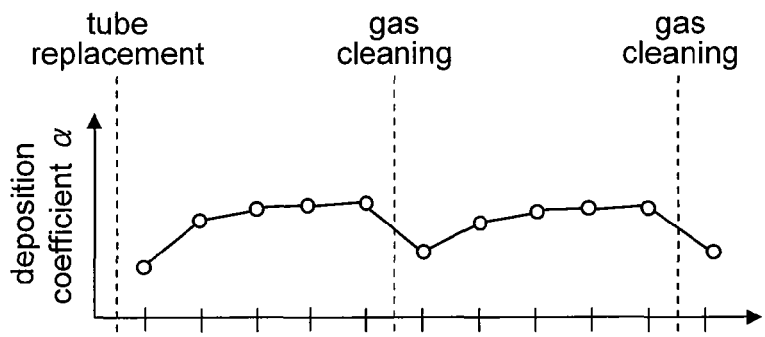
Fig. 3B
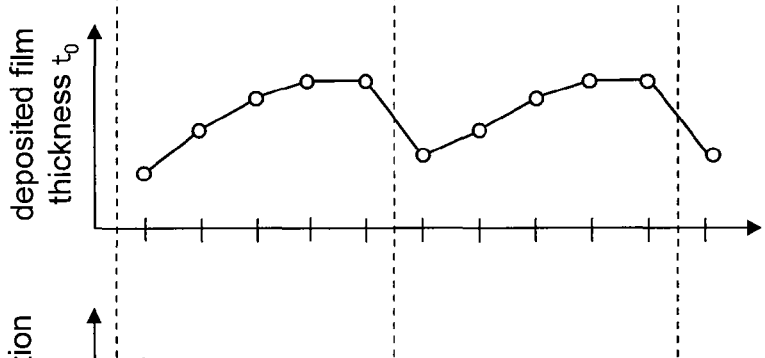
Fig. 3C
number of processing batches
Fig. 3D

SEMICONDUCTOR DEVICE MANUFACTURING METHOD AND SEMICONDUCTOR DEVICE MANUFACTURING APPARATUS

CROSS-REFERENCE TO RELATED APPLICATION

The disclosure of Japanese Patent Application No. 2008-173539 filed Jul. 2, 2008 including specification, drawings and claims is incorporated herein by reference in its entirety.

BACKGROUND OF THE INVENTION

1. Field of the Invention

The present invention relates to a semiconductor device manufacturing method and a semiconductor device manufacturing apparatus, and especially relates to a semiconductor device manufacturing method and a semiconductor device manufacturing apparatus which accurately control film thickness (film formation rate) in a batch-type film-forming apparatus, suppress manufacturing variation of semiconductor devices, and improve a manufacturing yield.

2. Description of the Related Art

As design rules of semiconductor devices become finer, more accurate control is demanded in manufacturing technologies of transistors and wirings. In manufacturing processes such as thermal oxidation, thermal diffusion, CVD (Chemical Vapor Deposition), and annealing which is one of its constituent technologies, a reduction of thermal budget is required in formation of thin films and ultra shallow junctions (USJs) of doped impurities. Therefore, in place of a batch type low-pressure CVD apparatus which is a furnace-type manufacturing apparatus long used for manufacturing semiconductor devices, a single-wafer-type rapid thermal processor (RTP) has come to be used. However, when forming a film of a small film formation rate to a relatively large film thickness of a dozen to several ten nm, because a single-wafer type manufacturing apparatus has a low manufacturing throughput, a manufacturing cost increases significantly. Therefore, a furnace-type manufacturing apparatus, which is a batch type, having a high productivity is used even at present.

As semiconductor devices become further minute, slight changes in the state of a manufacturing apparatus come to influence performances of the manufacturing process, making it difficult to realize a stable process just by controlling the manufacturing apparatus itself. For example, in the case of an oxide film-forming apparatus, even if temperature of wafers and temperature within the film-forming apparatus are controlled to be the same, depending on an apparatus condition of the film-forming apparatus, the thickness of an actually formed oxide film varies. In that case, sometimes used is an advanced process control (APC) which measures the oxide film thickness at a process monitor on the wafer, adjusts a processing time based on the measured film thickness to adjust to a target film thickness.

For example, a method described in Japanese Patent Application Laid-Open No. 2007-59945 is one of the APCs. In this priority document, in a manufacturing apparatus such as a furnace which performs manufacturing processes by thermal treatment, a low-pressure CVD apparatus, and an RTP, a process controller is installed. It is proposed that the oxide film thickness be calculated in the controller based on gas flow rate or temperature obtained from the manufacturing apparatus and that processes in the manufacturing apparatus be stopped when a desired oxide film thickness is reached.

SUMMARY OF THE INVENTION

However, there are several problems in the method described in the priority document.

While the above conventional method utilizes gas partial pressure obtained from the gas flow rate of the semiconductor manufacturing apparatus and temperature in predicting the thickness of an oxide film on a wafer, changes in the apparatus condition cannot be precisely grasped by these parameters only. This can be easily explained by considering the oxide film formation mechanism, the principles of measuring the parameters obtained from the manufacturing apparatus and nature of the parameters.

Oxygen atoms (or oxygen radicals) existing on a wafer surface obtain thermal energy and combine with silicon to become an oxide film. While the number of oxygen atoms can be obtained from the gas partial pressure, the wafer temperature is required to obtain the thermal energy. In a batch-type low-pressure CVD apparatus, thermocouples are installed within a reactor (tube) for example, controlling temperature (amount of thermal radiation) of each heater which heats the reactor to keep each of the temperatures measured by the thermocouples at a constant temperature. Alternatively, there is also a control method of predicting temperatures of wafers mounted on a boat within the tube using temperatures measured by the thermocouples and controlling temperature of the heater to keep the predicted wafer temperatures at a constant temperature.

If the batch type low-pressure CVD apparatus continues to be used, film formation is made in places such as the tube and boat other than wafers. As a result, the apparatus condition, in other words a way heat is conducted from the heater to the wafers, changes. Therefore, even if the temperature of each heater is controlled to a state wherein the temperatures measured by the thermocouples or the predicted wafer temperatures are the constant temperature, true wafer temperatures would not strictly coincide among batches, making the oxidation rate on the wafers vary. As the semiconductor device becomes further minute, the variation cannot be ignored, and in a case that a film thickness controlling of a several nanometer order is demanded, a variation in film thickness among batches based on the variation of the oxidation rate decreases the manufacturing yield.

Furthermore, the film formation rate does not depend only on the apparatus condition but a type of product to be processed for the film formation process. In technology adopted in recent years where a spacer is provided with side walls of gate electrodes of transistors constituting a semiconductor device to separate a channel region and source/drain regions, because a film is formed on the side wall, a film-forming area changes according to a gate electrode size and number of gate electrodes on the wafer. It is anticipated that if the film-forming area changes, the film formation rate will also change accordingly.

In addition, in the batch type low-pressure CVD apparatus, while the temperature of each heater is adjusted to a state in which the film formation rate on each wafer arranged in the longitudinal direction of the tube becomes uniform, when film forming simultaneously on wafers having different sizes and numbers of gate electrodes from one another, a balance among the film formation rates in the longitudinal direction of the tube collapses, and a variation of the film formation rate also occurs according to wafer mounted positions in the tube.

In addition, in the priority document, the film formation rate variations due to the product type (sizes of gate electrodes and number of gate electrodes) or processing positions in the apparatus are not taken into a consideration, and resultant variation in the film thickness cannot be reduced.

The present invention has been proposed by the conventional circumstances into consideration, and the objective is to provide a semiconductor device manufacturing method and a semiconductor device manufacturing apparatus which can reduce variations in film thickness on wafers even in the event that the apparatus condition has changed or when forming films simultaneously on multiple types of product wafers.

In order to accomplish the objects, the present invention adopts the following technical means. First, the present invention is supposed to be a semiconductor device manufacturing method comprising a film formation process which forms a film on a plurality of wafers placed in a processing chamber under a situation wherein heat is applied by a heat source outside the processing chamber through a wall of the processing chamber. Then, in the semiconductor device manufacturing method relating to the present invention, the film formation process is performed as follows. Firstly, based on a prediction formula obtained in advance and apparatus parameters obtained during a previously-performed film formation process, a predicated film formation rate value is computed. Here, the prediction formula is an equation showing a relationship between an amount of thermal energy reaching the wafer, the amount varying depending on a deposited film thickness on an inner wall of the processing chamber, and a film formation rate on the wafer in the processing chamber. The prediction formula is expressed as a function containing multiple apparatus parameters. Next, based on the computed predicted film formation rate value and a predetermined target film thickness, a processing time required for an amount of film formed on the wafer to reach the target film thickness is computed. Then, according to the computed processing time, the film is forms on the plurality of wafers. The apparatus parameters are various kinds of parameters which are controlled in performing the film formation process and various kinds of uncontrolled parameters which vary along with the control. For example, in a low-pressure CVD apparatus, temperature measured by an inner thermocouple, temperature measured by an outer thermocouple, heater power, gas flow rate, gas pressure, etc. can be used as the apparatus parameters.

According to the semiconductor device manufacturing method, even if conditions of the manufacturing apparatus changes, a film with a desired film thickness can be formed on the wafer in response to the changes. It is preferred that the semiconductor device manufacturing method determines whether the computed predicted film formation rate value is within a predetermined range, and performs a film formation process when it is determined that the computed predicted film formation rate value is within the predetermined range. Hence, in a case where the conditions of the manufacturing apparatus have changed to a state wherein the film formation rate is not tolerable, the film formation process is stopped. As a result, reduction in the manufacturing yield can be prevented.

In addition, in another semiconductor device manufacturing method relating to the present invention, first, a predicted film formation rate value is computed based on the above-mentioned prediction formula obtained in advance and apparatus parameters obtained during a previously-performed film formation process. Next, based on the computed predicted film formation rate value and a predetermined scheduled processing time, an amount of film formed on a wafer after the scheduled processing time has passed is computed. Then, a determination is made as to whether the computed formed film amount is within a predetermined range, and the film formation process for the plurality of wafers is performed when it is determined that the computed formed film amount is within the predetermined range.

According to this semiconductor device manufacturing method, the film formation process is performed only when a film with a desired film thickness can be formed. Therefore, because the film formation process is not performed in a case that the conditions of a manufacturing apparatus have changed into a state wherein the film with the desired film thickness cannot be formed, reduction in manufacturing yield can be prevented.

In the semiconductor device manufacturing method described above, the prediction formula obtained based on one film formation rate representing the film formation rates on all the plurality of wafers in the processing chamber may be used. In this case, the above-mentioned effects can be obtained very easily. In addition, it is preferred that the prediction formula contains a correction term to express an amount of variation in the film formation rate which depends on an area on which the film is formed on the plurality of wafers placed in the processing chamber. The correction term can be made a term containing a perimeter length of an element pattern already formed on each of the plurality of wafers for example. Furthermore, it is preferred that the prediction formula contains a correction term to express an amount of variation in the film formation rate which depends on a wafer mounting position in the processing chamber.

In addition, in yet another semiconductor device manufacturing method relating to the present invention, first, based on a base film formation rate prediction formula obtained in advance and apparatus parameters obtained during a film formation process performed immediately before, a predicted base film formation rate value is computed. The base film formation rate prediction formula is an equation obtained in advance in a state wherein bare wafers are placed on all wafer mounting positions in the processing chamber, and is an equation which expresses a relationship between an amount of thermal energy reaching the bare wafer in the processing chamber, the amount varying depending on a deposited film thickness on an inner wall of the processing chamber, and a film formation rate on the bare wafer in the processing chamber. The base film formation rate prediction formula is expressed as a function containing multiple apparatus parameters. Next, it is determined whether the computed predicted base film formation rate value is within a predetermined range. As a result of this determination, in a case where it is determined that the computed predicted film formation rate value is within the predetermined range, based on a film formation rate prediction formula obtained in advance and the above-mentioned apparatus parameters obtained during the film formation process performed immediately before, a predicted film formation rate value is computed. Here, the film formation rate prediction formula is an equation which expresses a relationship between the above-mentioned amount of thermal energy and a film formation rate on a product wafer mounted on the wafer mounting position in a processing chamber. As the film formation rate prediction formula, an equation wherein with a correction term added to the base film formation rate prediction formula can be adopted for example. The correction term expresses an amount of variation in the film formation rate which depends on an area on which the film is formed on the plurality of wafers placed in the processing chamber or an amount of variation in the film formation rate which depends on a wafer mounting position in the processing chamber. Subsequently, based on the computed predicted film formation rate value and a predetermined target film thickness, a processing time required for an amount of film formed on the product wafer in the processing chamber to reach the target film thickness is computed. Then, according to the computed processing time, the film formation process for a plurality of the product wafers is performed.

In this semiconductor device manufacturing method, the variation in the conditions of the manufacturing apparatus is grasped as the variation in the base film formation rate, and the film thickness is controlled based on the film formation rate on a product wafer. Therefore, the variation in the apparatus condition can be more precisely grasped. Thus, when the variation in the apparatus condition is within a tolerable range, formed film thickness can be accurately controlled.

In a case where it is determined the computed formed film amount, the predicted film formation rate value or the computed predicted base film formation rate value is outside the corresponding predetermined range in each of the above-mentioned determinations, it is preferred that the film deposited on the inner wall is removed by introducing a cleaning gas into the processing chamber with no wafer. By this, the apparatus condition can be restored to an initial condition.

On the other hand, from another viewpoint, the present invention can also provide a semiconductor device manufacturing apparatus forming a film on a plurality of wafers placed in a processing chamber while heated by a heat source outside the processing chamber through a wall of the processing chamber. In other words, the semiconductor device manufacturing apparatus relating to the present invention comprises a film formation rate computing unit, a data collection unit, a processing condition computing unit and an apparatus control unit. The film formation rate computing unit is configured to compute a predicted film formation rate value by substituting apparatus parameters during a previously-performed film formation process obtained by the data collection unit into a preregistered prediction formula. Here, the prediction formula is an equation which expresses a relationship between an amount of thermal energy reaching the wafer in the processing chamber, the amount varying depending on a deposited film thickness on an inner wall of the processing chamber, and a film formation rate on the wafer in the processing chamber. The prediction formula is expressed as a function containing multiple apparatus parameters. The processing condition computing unit is configured to compute a processing time required for an amount of film formed on a wafer to reach a predetermined target film thickness based on the predicted film formation rate value computed by the film formation rate computing unit and the target film thickness. Then, the apparatus control unit is configured to perform a film formation process for the plurality of wafers according to the processing time computed by the processing condition computing unit.

The semiconductor device manufacturing apparatus may further comprise an anomaly determination unit. The anomaly determination unit is configured to determine whether the predicted film formation rate value computed by the film formation rate computing unit is within a predetermined range. In this case, in a case where the anomaly determination unit determines that the predicted film formation rate value is within the predetermined range, the apparatus control unit performs the film formation process.

In addition, another semiconductor device manufacturing apparatus relating to the present invention comprises a film formation rate computing unit, a data collection unit, an anomaly determination unit and an apparatus control unit. The film formation rate computing unit is configured to compute a predicted film formation rate value by substituting apparatus parameters during a previously-performed film formation process obtained by the data collection unit into above-mentioned prediction formula. In addition, the film formation rate computing unit is configured to compute an amount of film formed on the wafer after a predetermined scheduled processing time has passed based on the computed predicated film formation rate value and the scheduled processing time. The anomaly determination unit is configured to determine whether the formed film amount computed by the film formation rate computing unit is within a predetermined range. Then, in a case where the anomaly determination unit determines that the formed film amount is within the predetermined range, the apparatus control unit performs a film formation process for the plurality of wafers.

The present invention can prevent performing of anomalous processes caused by the variation in film formation rate due to the change in the apparatus condition of a batch-type film-forming apparatus along with its use, the variation in film formation rate which occurs when processing product wafers having different total gate perimeter lengths in a same batch, etc. In addition, even when such variations in film formation rate occur, the film thickness can be controlled to a desired value. As a result, the manufacturing yield of semiconductor devices can be improved, and the variation among batches can also be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3C are schematic graphs showing an example of dependencies of a deposition coefficient of a tube inner wall, a deposited film thickness and a film formation rate on the number of processing batches.

FIG. 3D shows film thickness on the inner tube wall.

DETAILED DESCRIPTION OF PREFERRED EMBODIMENTS

Embodiments relating to the present invention are explained hereafter, with reference to drawings. In each of the following embodiments, the present invention is realized as a case of a batch type low-pressure CVD apparatus.

First Embodiment

Figure 1:
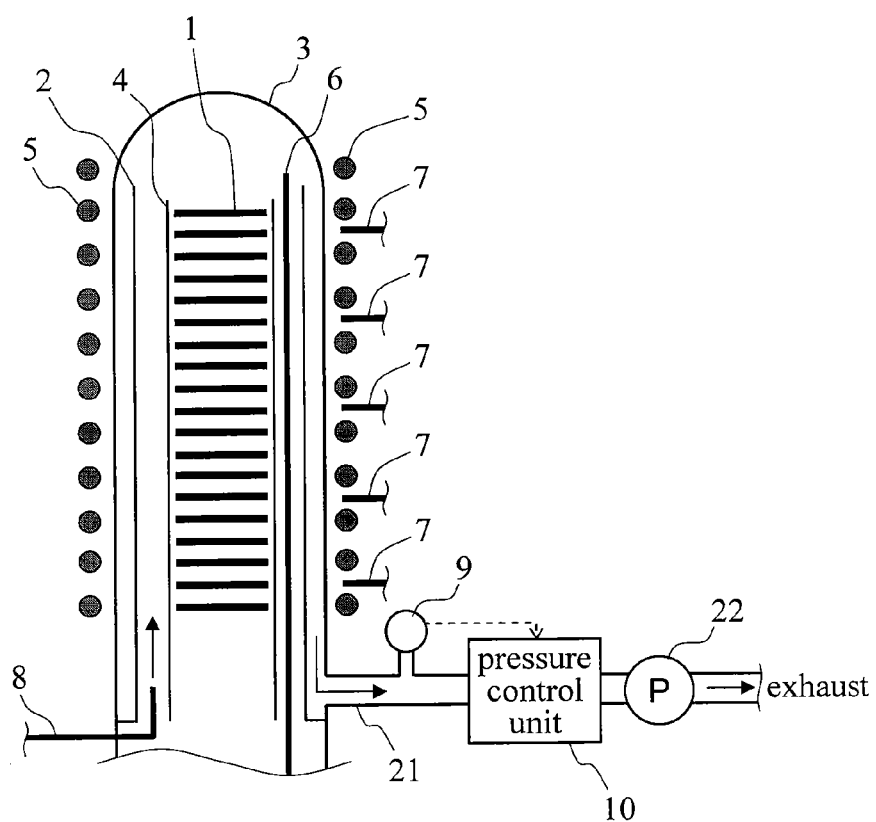
FIG. 1 is a schematic configuration diagram showing an example of a film-forming apparatus to which the present invention is applied.

FIG. 1 is a schematic configuration diagram showing an essential part of a batch type low-pressure CVD apparatus which is a semiconductor device manufacturing apparatus relating to this embodiment. The apparatus forms a film such as an oxide film or the like.

As shown in FIG. 1, the low-pressure CVD apparatus is provided with a cylindrical outer tube 3 made of quartz or silicon carbide (SiC) having a central axis in a vertical direction. A cylindrical inner tube 2 made of quartz having a central axis in the vertical direction is arranged in the outer tube 3. The inner tube 2 has its both ends open and its bottom supported by the outer tube 3.

The outer tube 3 has only its bottom open, and a boat 4 mounted multiple wafers is carried in/out through the open end. The boat 4 is made of quartz or SiC for example and supports wafers to be processed keeping them horizontal at a certain interval in the vertical direction. The boat 4 is supported by a cap (not shown) which opens/closes the open end of the outer tube 3, and is moved into/out of the outer tube 3 in one unit with the cap. Here, a space made airtight by the cap and the outer tube 3 constitutes a reactor (processing chamber).

On a side face of the outer tube 3 below the bottom of the inner tube 2, a gas introduction pipe 8 is connected. A process gas or purge gas introduced into the inner tube 2 via the gas introduction pipe 8 flows from the bottom side to the top side within the inner tube 2. The gas achieved the top of the inner tube 2 is exhausted to an exhaust pipe 21 connected to a vacuum pump 22 through a space between the outer tube 3 and the inner tube 2. In an upstream side of the vacuum pump 22, a pressure control unit 10 which adjusts an exhaust capacity of the exhaust pipe 21 is provided. The pressure control unit 10 adjusts the exhaust capacity to conditions wherein a pressure value measured by a pressure measurement unit 9 placed between the pressure control unit 10 and the outer tube 3 is a specified pressure value. For example, the pressure control unit 10 can be constructed with a butterfly valve or gas ballast.

On the periphery of the outer tube 3, a plurality of ring-shape resistance heaters 5 (hereafter, referred to as heaters 5) which heats within the reactor is provided. Not only the resistance heater but also an arbitrary heat source can be used for heating the reactor. The heaters 5 are divided into multiple pieces along the outer tube 3, each of heaters 5 can independently control a heating value (heater power). In addition, a plurality of outer thermocouples 7 is arranged outside the outer tube 3 (between neighboring heaters 5 for example) along the outer tube 3. A plurality of inner thermocouples 6 of which tips is disposed at different heights from one another is arranged inside the outer tube 3 (between the inner tube 2 and the boat 4 for example).

Figure 2:
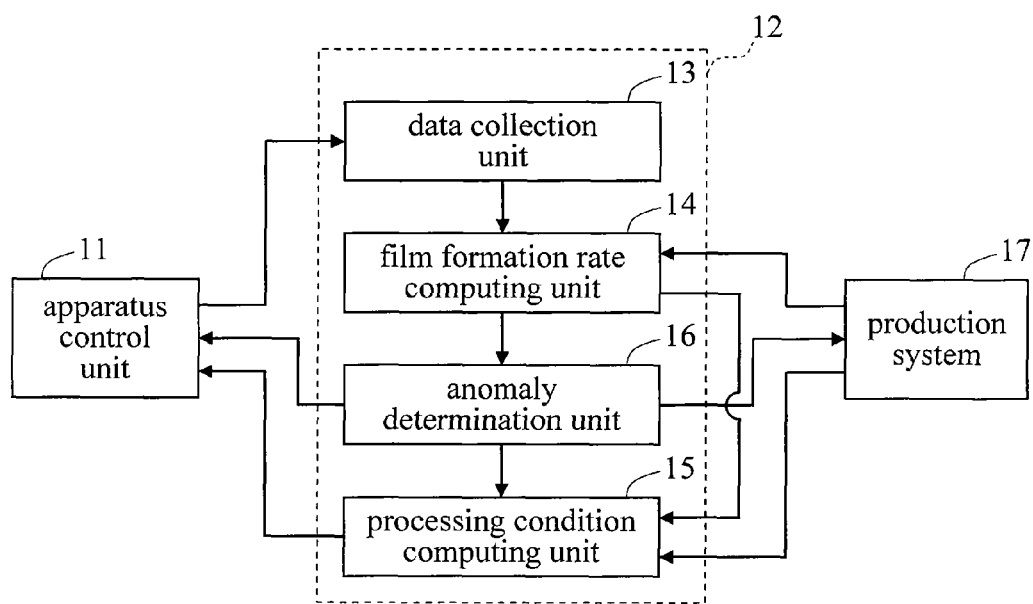
FIG. 2 is a functional block diagram showing an example of a control system of a film-forming apparatus to which the present invention is applied.

FIG. 2 is a functional block diagram showing a control system of the low-pressure CVD apparatus. As shown in FIG. 2, the low-pressure CVD apparatus is provided with an apparatus control unit 11 and a process control unit 12.

The apparatus control unit 11 controls an output (heater power) of each of the heaters 5 based on temperatures measured by the inner thermocouples 6 and the outer thermocouples 7. The apparatus control unit 11 also controls apparatus parameters such as flow rates of various kinds of gases introduced via the gas introduction pipe 8, pressure in the reactor, the processing time and the like.

The process control unit 12 is provided with a data collection unit 13, a film formation rate computing unit 14, a processing condition computing unit 15 and an anomaly determination unit 16. The data collection unit 13 collects an apparatus condition (such as apparatus parameters) from the apparatus control unit 11 and stores the apparatus condition. As described in detail below, the film formation rate computing unit 14 predicts a film formation rate based on the data collected by the data collection unit 13. The processing condition computing unit 15 computes processing conditions based on the predicted film formation rate value computed by the film formation rate computing unit 14, and a target film thickness, an element pattern perimeter length such as a total perimeter length of gate patterns on a product wafer and the number of wafers obtained from a production system 17. Here, the production system 17 shown in FIG. 2 is a system which controls a production situation such as lot progress of a semiconductor device production line to which the low-pressure CVD apparatus belongs. Furthermore, the anomaly determination unit 16 determines whether the film formation rate computed by the film formation rate computing unit 14 is within a predetermined reference range. Here, the processing condition computing unit 15 sends the computed processing conditions to the apparatus control unit 11.

The apparatus control unit 11, the data collection unit 13, the film formation rate computing unit 14, the processing condition computing unit 15 and the anomaly determination unit 16 can be realized by an exclusive-use calculation circuit, or hardware having a processor and memories such as RAM (random access memory) or ROM (read only memory), etc. and software stored in the memories and operating on the processor. In addition, the data collection unit 13 further comprises a storage device such as HDD (hard disk drive) storing the collected data.

In the construction described above, when the boat 4 is set in the outer tube 3, a process gas is introduced via the gas introduction pipe 8 into the outer tube 3, and pressure in the outer tube 3 is decreased by the vacuum pump 22 and maintained a specified pressure value. At this time, the inside of the outer tube 3 is held at a constant temperature by the heaters 5. The heating value of each heater 5 is controlled so as to achieve a state having a specified target temperature (or a specified wafer temperature predicted by a specific algorithm) based on the temperatures measured by the inner thermocouples 6 and the outer thermocouples 7. Therefore, a film corresponding to the introduced process gas is formed on each wafer mounted on the boat 4.

In the low-pressure CVD apparatus having the above construction, the film formation rate on each wafer can vary according to (a) the change in the apparatus condition, (b) patterns formed on each wafer to be processed and the number of the wafers, and (c) a wafer mounting position on the boat 4.

In other words, as the film formation process in the reactor is repeated, films are also formed on the inner wall of the inner tube 2, the inner wall of the outer tube 3 and the boat 4. By such a change in the conditions within the reactor, the manner of heat conduction from the heaters which are heat sources to the tubes, the boat and the wafers, making the film formation rate on each wafer changes. In addition, when an amount of deposited film other than onto the wafers increases, particles generated from the deposited film adhere onto the wafers during the film formation process, thereby the manufacturing yield is decreased. In order to prevent such reduction in the manufacturing yield, a maintenance such as gas cleaning which removes depositions on the inner wall of the inner tube 2, the inner wall of the outer tube 3 and the boat 4 (hereafter, referred to as simply the tube inner wall), or replacement of the inner tube 2, the outer tube 3 and the boat 4 are performed at a specific timing. The film formation rate on each wafer in the reactor also changes by such maintenance.

In addition, in a production line which produces many types of products, because an element pattern formed on a wafer such as a shape and an arrangement of gate pattern for example changes depending on the product type, a sum of the element pattern perimeter lengths changes. Especially, in a process of forming sidewall spacers of gate electrodes in transistors, a film-forming area changes according to the product type. In other words, the larger the total gate perimeter length on a wafer, the lager the film-forming area becomes. Therefore, the film formation rate changes according to the type of product wafer (total gate perimeter length) and the number of wafers in a low-pressure CVD apparatus.

Furthermore, while the film-forming apparatus is adjusted (corrected) after a maintenance for example so as to provide uniform temperature distribution in the longitudinal direction of the outer tube 3 (in the direction the wafers are arranged), once a production is started afterwards, its temperature balance may be broken caused by inserted wafers. As a result, the film formation rate comes to vary along the longitudinal direction of the tube. Therefore, a variation in film thickness within a batch based on the variation of the film formation rate decreases the manufacturing yield.

In this embodiment, by employing a film formation rate prediction formula which accounts for a change of the apparatus condition, differences in the types of wafers to be processed and the number of wafers, and differences in the water processing positions in the apparatus as described above, the variation in the film thickness is suppressed. The prediction formula is explained hereafter.

First, the film formation rate change when only the apparatus condition changes will be described. The film formation rate when only the apparatus condition changes can be observed if film formation process is performed in a state wherein wafers with no pattern formed (hereafter, referred to as bare wafers) are placed in all the mounting positions of the boat 4 (hereafter, referred to as full-batch state).

The film formation rate on a specific wafer in the low-pressure CVD apparatus depends on the amount of depositing radicals and thermal energy on the wafer, and can be considered to be proportional to the product of the amount of depositing radicals and thermal energy. The amount of depositing radicals can be expressed in terms of gas flow rate (partial pressure) at the time of film formation process. While the thermal energy on the wafer is radiated from the heaters 5 which are heat sources, because the amount of thermal energy radiated from the heaters 5 changes according to the deposited film thickness on the tube inner wall, it cannot be expressed by the heater power alone. In other words, the amount of heat absorbed to the deposited film on the tube inner wall must be subtracted from the heater power. In addition, because a deposition coefficient α of depositing radicals onto the tube inner wall is believe to change according to the number of times of processing, the deposited film thickness on the tube inner wall does not simply increase in proportion to the number of processing times. Therefore, the film formation rate on a specific wafer in the low-pressure CVD apparatus varies in a complex manner according to the increase in the number of processing times.

FIGS. 3A to 3C are schematic graphs showing an example of dependencies of the deposition coefficient α, the deposited film thickness $t_0$ on the tube inner wall (FIG. 3D) and the film formation rate $R_0$ on a wafer mounted at a specific wafer processing position on the number of times of processing. In FIGS. 3A to 3C, the horizontal axis corresponds to the number of times of processing (number of processing batches). The vertical axis of FIG. 3A corresponds to the deposition coefficient α, the vertical axis of FIG. 3B to the deposited film thickness $t_0$, and the vertical axis in FIG. 3C to the film formation rate $R_0$.

In the low-pressure CVD apparatus, a specified pre-processing (film formation in a state wherein no wafer is mounted on the boat 4) is performed immediately after gas cleaning and immediately after tube replacement, and film formation on wafers is performed thereafter. The state of the tube inner wall after this pre-processing becomes almost the same state. Therefore, it is believed that the deposition coefficient α is nearly the same value immediately after gas cleaning and immediately after tube replacement. If film formation on wafers is performed in this state, the film is also deposited on the tube inner wall. As shown in FIG. 3B, the deposited film thickness $t_0$ of the deposited film on the tube inner wall (see FIG. 3D) gradually increases immediately after gas cleaning (including immediately after tube replacement) as the number of times of processing increases.

When a film is deposited on the tube inner wall, a part of thermal energy radiated from the heaters 5 is absorbed into the deposited film on the tube inner wall. As the absorption of thermal energy by the deposited film on the tube inner wall becomes larger, the amount of thermal energy reaching wafers mounted on the boat 4 decreases. As described above, temperature (amount of thermal energy) is measured by the inner thermocouples 6 in the tube, and if the amount of thermal energy reaching the inner thermocouples 6 decreases, thermal energy radiated by the heaters 5 is increased to compensate the decrease. As a result, the amount of thermal energy absorbed by the deposited film on the tube inner wall becomes larger, and the deposition coefficient α increases as shown in FIG. 3A.

Moreover, the dependencies of the deposition coefficient α, the deposited film thickness $t_0$ on the tube inner wall and the film formation rate $R_0$ on the number of times of processing show varying behaviors according to the absorption rate of heat, namely the kind of film to be deposited. For example, when the film deposited on the tube inner wall is thin and the thermal energy absorbed by the deposited film is small, the amount of thermal energy reaching the wafers never decreases significantly. In this case, thermal energy used for depositing a film on the tube inner wall does not increase, and the deposition coefficient α does not increase, either. In this case, if the state of the tube inner wall immediately after the pre-processing made it easy for a film to deposit caused by the state of the tube inner wall, it is possible for a case to occur wherein the deposition coefficient α decreases as the number of times of processing increases.

The film deposition on the tube inner wall as the above occurs in parallel with the film formation onto wafers. In addition, the inner thermocouples 6 cannot instantly grasp thermal energy variation according to the measurement principle. In other words, only when a decrease in the reaching energy caused by the increase in the deposited film thickness $t_0$ is detected by the inner thermocouples 6, thermal energy radiated by the heaters 5 increases. Therefore, the temperatures measured by the inner thermocouples 6 cannot be instantly followed with variation in the deposition coefficient α (variation in the rate of increase in the deposited film thickness $t_0$), and the film formation rate $R_0$ onto a wafer mounted on the boat 4 also varies as shown in FIG. 3C. In the case of FIG. 3C, as the number of times of processing increases, the film formation rate $R_0$ gradually decreases from the film formation rate immediately after gas cleaning (including immediately after tube replacement).

As described above, while the film formation rate $R_0$ varies in a complex manner as the number of times of processing increases, it can be understood that the variation occurs because of absorption of thermal energy by the film deposited on the tube inner wall, namely energy loss due to the deposited film. Therefore, by considering the deposited film thickness $t_0$ on the tube inner wall, the variation of the film formation rate $R_0$ caused by the apparatus condition only can be predicted. The energy loss can be expressed as $\beta \cdot a_t \cdot t_0$ using the thermal absorption rate $a_t$ of the film deposited on the tube inner wall, the deposited film thickness $t_0$ and a constant $\beta$. Therefore, the film formation rate $R_0$ can be expressed by a following equation (1).

$$R_0 \propto \text{(amount of depositing radicals)} \times \text{(thermal energy)} \propto \quad (1)$$
$$\text{(gas partial pressure)} \times \text{(heater power} - \text{energy loss)} =$$
$$\text{(gas partial pressure)} \times \text{(heater power} - \beta \cdot a_t \cdot t_0)$$

Whereas it is not impossible to actually measure the deposited film thickness $t_0$ in the low-pressure CVD apparatus, from the viewpoint of a manufacturing throughput or in-situ data acquisition, it is preferred to replace the deposited film thickness $t_0$ with the apparatus parameters which can be measured in-situ. Then, expressing the deposited film thickness $t_0$ with the apparatus parameters is investigated. For example, when the deposited film thickness $t_0$ is large, the possibility is considered that the inner thermocouples 6 become poorer in following a set temperature. Therefore, the deposited film thickness $t_0$ can be assumed to be a function having a difference between the set value and the actually-measured value of temperature of the inner thermocouples 6 as a variable. In this manner, if the deposited film thickness $t_0$ is replaced with the apparatus parameters, the film formation rate $R_0$ can be expressed as a function of the apparatus parameters.

In this embodiment, from the viewpoint of predicting the film formation rate $R_0$ more accurately, it is assumed that the amount of thermal energy reaching the wafer which varies depending on the deposited film thickness $t_0$ can be expressed as a function of multiple apparatus parameters. In addition, in this embodiment, a first-order polynomial expression (equation (2)) having multiple apparatus parameters as its explanatory variables which is believed to be the simplest equation which can express the equation (1) as the prediction formula of the film formation rate $R_0$.

$$R_0 = k_1 \cdot P_1 + k_2 \cdot P_2 + k_3 \cdot P_3 + \ldots + k_n \cdot P_n + K \quad (2)$$

In the equation (2), the explanatory variables $P_1$ to $P_n$ are statistical values of the apparatus parameters such as temperature measured by the inner thermocouples 6, temperature measured by the outer thermocouples 7, heater power, gas flow rate, gas pressure, etc. collected by the data collection unit 13, respectively. Here, the statistical values, for example, denote the average, median, standard deviation, variance or range (maximum-minimum) of the apparatus parameters obtained during one film formation process. In addition, coefficients $k_1$ to $k_n$ are coefficients corresponding to the respective apparatus parameters. For example, the coefficients $k_1$ to $k_n$ and the constant K can be obtained by a multiple regression analysis targeting the statistical values of the apparatus parameters obtained through multiple film formation processes and the actually-measured value of film formation rate in each of film formation processes wherein the apparatus parameters have been obtained to compute the statistical values. Moreover, the actually-measured value of film formation rate can be computed, for example, by measuring a thickness of a film formed by using a film thickness meter and dividing the measured thickness by the film formation process time for forming the film. In addition, for the apparatus parameters used as the explanatory variables $P_1$ to $P_n$ in the equation (2), apparatus parameters having high correlation with the film formation rate $R_0$ may be appropriately selected by a variable determination method such as a multivariate analysis, a forward-backward stepwise method or the like. Further, as can be understood from the above equation (1), the explanatory variables $P_1$ to $P_n$ should include at least the apparatus parameters expressing the heater power and the deposited film thickness $t_0$. In addition, the prediction formula of the film formation rate $R_0$ is not limited to the first-order polynomial expression, but a second-order function, exponential function or logarithmic function of the apparatus parameters, for example, may be used.

Furthermore, strictly speaking, the deposited film thickness $t_0$ depends on the height-direction position of the tube. However, in this embodiment for the sake of simplification, assumed is a state wherein a uniform deposited film exists on the tube inner wall. In this case, as the actually-measured value of film formation rate used for calculating the coefficients $k_1$ to $k_n$ and the constant K in the equation (2), the actually-measured value of film formation rate of one representative wafer selected from bare wafers mounted on the boat 4 or an average of the actually-measured values of film formation rate of the bare wafers for example can be used.

Next, the change in film formation rate based on the type of wafer to be processed and the number of wafers, and the wafer processing position in the low-pressure CVD apparatus will be described.

Here, a total deposition amount $D_T$ in one film formation process is assumed to be expressed as in a following equation (3).

$$\text{total deposition amount } D_T = \quad (3)$$
$$\text{sum of deposition amount } D_W \text{ on each wafer} +$$
$$\text{deposition amount } D_O \text{ other than wafers (tube, etc.)} +$$
$$\text{amount } W_E \text{ exhausted to the exhaust pipe 21}$$

In addition, the first term on the right side of the equation (3) can be represented as the sum of deposition amount $D_B$ each of films formed on bare wafers and the sum of deposition amount $D_P$ each of films formed on product wafers. Here, for example, the bare wafers are dummy wafers mounted on the boat 4 together with the product wafers. The dummy wafers are multiple sheets of wafers mounted on both ends of the boat 4 (top and bottom ends in FIG. 1). In addition, if multiple types of product wafers are mounted on the boat 4, multiple sheets of the dummy wafers are mounted also between a group of product wafers of the same product type and a group of product wafers of another product type. This dummy wafers have a function to secure uniform heating lengths at both ends of the boat 4 and at the product wafer group end. If the product wafer is silicon (Si) substrate, an SiC substrate or Si substrate, for example, can be used as the dummy wafer.

In a case that the first term on the right side of the equation (3) is interpreted as the sum of the deposition amount $D_B$ each of films formed on bare wafers and the sum of the deposition amount $D_P$ each of films formed on product wafers, the equation (3) can be expressed by a following equation (4).

$$D_T = \Sigma D_B + \Sigma D_P + D_O + W_E \qquad (4)$$

In addition, as described above, the film formation rate on each product wafer depends on the total area of films formed on the product wafer group. For example, as the element pattern perimeter length increases, or as the number of wafers belonging to a group of product wafers of the same product type increases, the film formation rate on the product wafers belonging to the product wafer group decreases. Hereafter, explanations are given assuming that the element pattern is a gate pattern.

Figure 4:
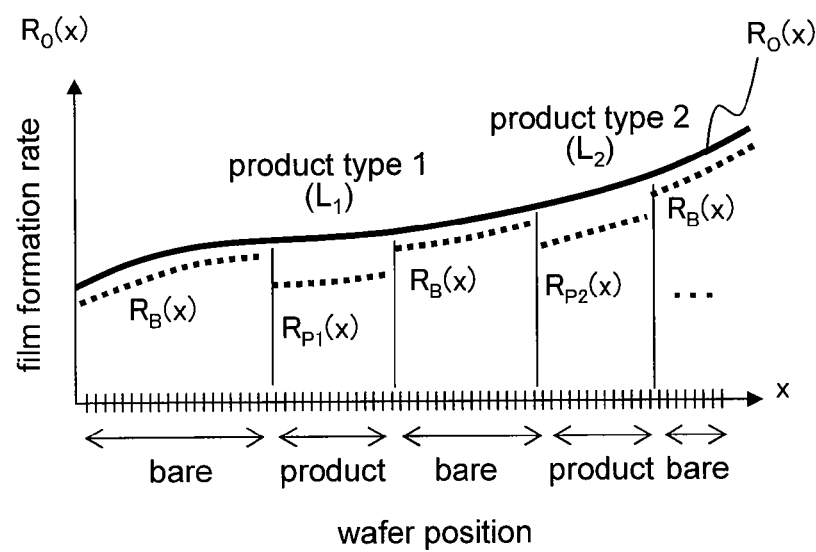
FIG. 4 is a schematic graph showing film formation rates on wafers belonging to a same batch.

FIG. 4 is a schematic graph showing the film formation rate on each wafer in a full-batch state wherein multiple types of product wafers of different gate perimeter lengths are mounted in different wafer mounting positions on the boat 4, and bare wafers are mounted in another wafer mounting positions on the boat 4. In FIG. 4, the horizontal axis corresponds to the wafer position in the low-pressure CVD apparatus, and the vertical axis corresponds to the film formation rate. In addition, the left end of the horizontal axis corresponds to the top of the boat 4 shown in FIG. 1, and the right direction of the horizontal axis corresponds to the direction toward the bottom of the boat 4. Here, among multiple product wafers of the same type mounted on the boat 4, only product wafer group $W_1$ (gate perimeter length $L_1$ per one product wafer) and product wafer group $W_2$ (gate perimeter length $L_2$ per one product wafer). Further, multiple bare wafers are mounted between the product wafer groups mounted on the boat 4 and on both ends of the boat 4, respectively.

A curve $R_0(x)$ shown in a solid line in FIG. 4 is a base film formation rate. Here, the base film formation rate is the film formation rate on wafers when bare wafers are mounted in all the wafer mounting positions of the boat 4. Shown in broken lines in FIG. 4, a curve $R_B(X)$ is the film formation rate on bare wafers, a curve $R_{P1}(x)$ is the film formation rate on product wafers belonging to the first product wafer group $W_1$, a curve $R_{P2}(x)$ is the film formation rate on product wafers belonging to the second product wafer group $W_2$. Here, the argument x represents the mounting position of wafers on the boat 4 (see FIG. 4).

In a case that conditions of process gas introduction in each film formation process are the same, the total deposition amount $D_T$ in each film formation process is a constant. In this case, according to the equation (4), when the sum $\Sigma D_P$ of the deposition amounts of films formed on product wafers increases, the sum $\Sigma D_B$ of the deposition amounts of films formed on bare wafers decreases. In addition, as described above, the film formation rate of product wafers declines depending on the total gate perimeter length and the number of wafers. However, because the film formation rate never declines to the point wherein the deposition amount $D_P$ each of films formed on product wafers (film formation rate×film-forming area) becomes a constant, as a result the deposition amount $D_P$ each of films formed on product wafers increases. Therefore, the film formation rate on dummy wafers also decreases depending on the total film-forming area of product wafers. In other words, when the total gate perimeter length of product wafers is long and the number of wafers is large, as shown in FIG. 4, not only the film formation rate on product wafers but also the film formation rate on dummy wafers decreases relative to the base film formation rate $R_0(x)$. In the schematic graph in FIG. 4, because of the total gate perimeter length $L_1$>the total gate perimeter length $L_2$, the amount of decrease of the curve $R_{P1}(x)$ relative to the base film formation rate $R_0(x)$ becomes larger than the amount of decrease of the curve $R_{P2}(x)$ relative to the base film formation rate $R_0(x)$.

Based on the above, it is believed that a film formation rate R in a processing for the product wafers depends on variation in the apparatus condition, the product type and the number of wafers to be processed. In addition, when a plurality of wafer groups of different product types is mounted on the same boat 4, the balance of temperature uniformity in the longitudinal direction of the tube is broken as described above, and the film formation rate varies depending on the position along the longitudinal direction of the tube. In this embodiment, a following equation (5) is employed as the simplest formula considering these parameters as variables.

$$R = R_0 - \Sigma A_i \cdot L_i \cdot N_i - \Sigma B_i \cdot F_{Pi} \qquad (5)$$

In the equation (5), a first term on the right side is the base film formation rate $R_0$ obtained from the apparatus parameters of the low-pressure CVD apparatus. The first term on the right side can be expressed, for example, by the equation (2) described above. In addition, a second term on the right side is a film formation rate correction term due to the product type of wafers and the number of wafers. Here, based on the above consideration, the second term on the right side is expressed as the sum of a product of the total film-forming area and a coefficient $A_i$ calculated by each product wafer group belonging to the same batch. In other words, the product of the total gate perimeter length $L_i$ per one product wafer, the number of wafers $N_i$ and the coefficient $A_i$ of product wafers among a product wafer group i consisting of the same product type belonging to the same batch is summed over all the product wafer groups belonging to the same batch. Here, the coefficient $A_i$ is a coefficient determined according to film-forming condition such as a kind of process gas, gas flow rate, processing pressure and processing temperature. Furthermore, a third term on the right side is a film formation rate correction term due to the in-furnace processing position of the wafer. Here, based on the above consideration, the third term on the right side is expressed as the sum of a product of a position factor (an in-furnace position correction coefficient) $F_{Pi}$ determined by the mounting position of the product wafer group i belonging to the same batch on the boat 4 and a coefficient $B_i$. The position factor $F_{Pi}$ is a parameter for correcting, for example, the difference in the amount of film formation rate decrease occurring between the case wherein the product wafer group i consisting of the same product type is mounted in the upstream side of the process gas (the bottom side of the boat 4 in FIG. 1) and the case wherein it is mounted in the downstream side of process gas (the top side of the boat 4 in FIG. 1). The position factor $F_{Pi}$ can be determined according to the product type and the film-forming condition. Also, the coefficient $B_i$ is, for example, a coefficient determined by the film-forming condition.

Moreover, because the equation (2) is simplified by assuming that a uniform deposited film exists on the tube inner wall in this embodiment, the base film formation rate $R_0$ has no dependence on the position x. Therefore, the film formation rate R at the time of processing for the product wafers computed by the equation (5) also has no dependence on the position x. In other words, according to the equation (5), the amounts of film formation rate decrease in each of the product wafer groups occurring when multiple kinds of product wafer groups of different total gate perimeter lengths are mounted in different positions on the boat 4 are averaged, and the averaged amount of film formation rate decrease is uniformly reflected on all the product wafers mounted on the boat 4 to compute a film formation rate. In this case, the coefficients $A_i$, $B_i$, and the position factor $F_{Pi}$ in the equation (5) may be obtained by employing the multiple regression analysis on data obtained in the past with the low-pressure CVD apparatus. In doing so, as the actually-measured value of film formation rate required in the multiple regression analysis to compute the coefficients $A_i$, $B_i$ and the position factor $F_{Pi}$, the value for a representative wafer or the average value of the product wafers can be used. Moreover, depending on the film-forming condition, there may occur a case wherein the position factor $F_{Pi}$ can be regarded as zero. In this case, the third term on the right side of the equation (5) may be omitted.

Figure 5:
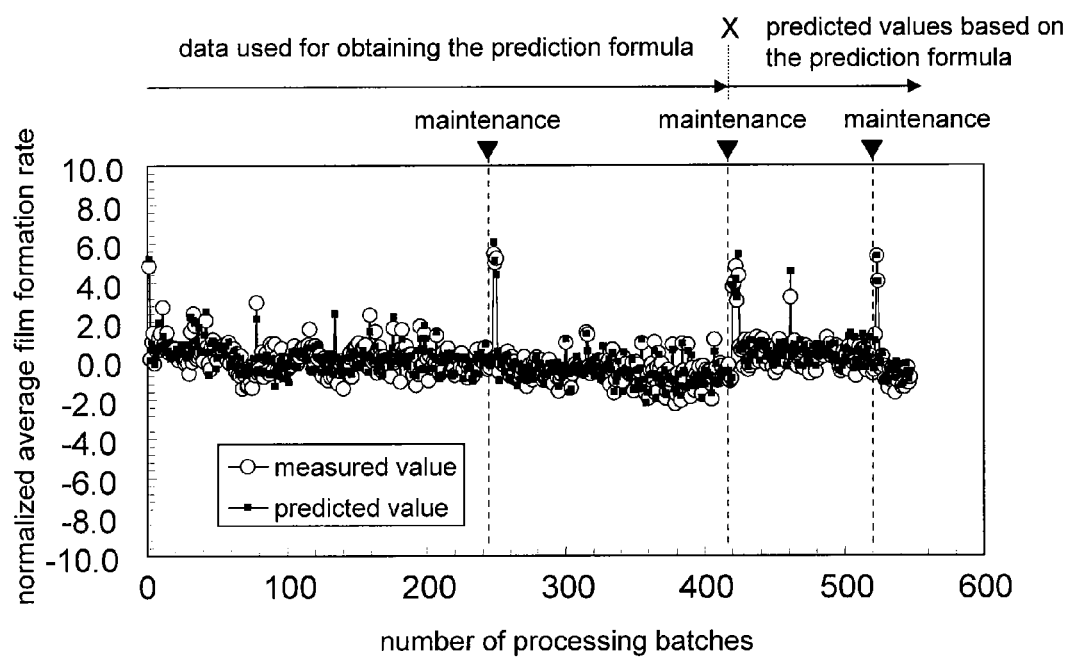
FIG. 5 is a graph showing a predicted value and measured value of film formation rate in a first embodiment relating to the present invention.

In this embodiment, the film formation rate R computed by the equation (5) is used as the predicted value of film formation rate. FIG. 5 is a graph showing an average of the actually-measured film formation rate values of wafers processed in the same batch and the predicted film formation rate values computed by the equation (5). In FIG. 5, the vertical axis corresponds to a normalized average film formation rate, and the horizontal axis to the number of time of processing (number of processing batches). Here, the normalized average film formation rate for the actually-measured film formation rate value is calculated using an average and a standard deviation computed from averages of the actually-measured film formation rate values obtained over multiple batches by a formula of (average of the actually-measured film formation rate values in one batch−average of averages of the actually-measured film formation rate values in the multiple batches)/(standard deviation of averages of the actually-measured film formation rate values in the multiple batches). In the similar manner, the normalized average film formation rate for the predicted film formation rate value is calculated using an average and a standard deviation computed from the predicted film formation rate values obtained over multiple batches by a formula of (the predicted film formation rate value for one batch−average of the predicted film formation rate values in the multiple batches)/(standard deviation of the predicted film formation rate values in the multiple batches). In FIG. 5, the coefficients $A_i$, $B_i$, and the position factor $F_{Pi}$ in the equation (5) are computed using the actually-measured film formation rate values up to the number of processing batches X, and the film formation rate after the number of processing batches X is predicted.

From FIG. 5, it can be understood that the predicted and actually-measured values coincide with each other with high accuracy. Therefore, a desired film thickness can be formed on a wafer by performing the film formation process for a processing time computed by dividing a film thickness to be formed by the predicted film formation rate value. The film thickness to be formed is a film thickness computed by the target film thickness $T_{target}$−the initial film thickness $T_0$. Here, the initial film thickness $T_0$ is an incubation component caused by the low-pressure CVD apparatus and is assumed to be a constant in this embodiment.

Figure 6:
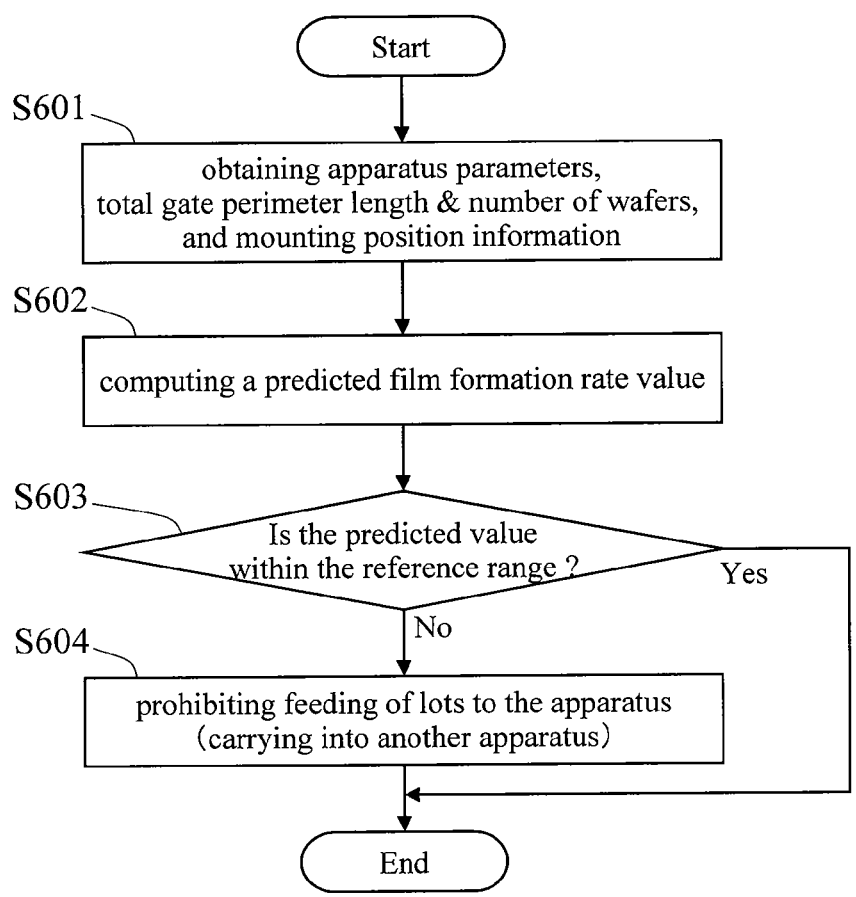
FIG. 6 is a flowchart showing an anomaly determination processing in the first embodiment relating to the present invention.

In addition, by using the predicted film formation rate value computed by the equation (5), reduction in the manufacturing yield can be prevented. FIG. 6 is a flowchart showing an anomaly determination processing which stops the film formation process when the predicted film formation rate value is outside a reference range, performed in the low-pressure CVD apparatus of this embodiment (see FIGS. 1 and 2). The anomaly determination processing can be performed before starting the film formation process, for example, at a timing when a lot feed instruction is input from the production system 17. Here, the lot feed instruction denotes an instruction wherein the production system 17 specifies a product wafer group (lot) to be processed as a next batch in the low-pressure CVD apparatus. Hereafter, it is assumed that the film formation process under the same processing conditions (kind of process gas and film-forming temperature) is repeatedly performed.

When the anomaly determination processing is started, first, the film formation rate computing unit 14 obtains the apparatus parameters at the time of a previous film formation process (for example, the film formation process performed immediately before the target batch which is an object for the anomaly determination) from the apparatus control unit 11 via the data collection unit 13. In addition, the film formation rate computing unit 14 obtains the total gate perimeter length $L_i$ and the number of wafers $N_i$ belonging to the target batch from the production system 17. In addition, the film formation rate computing unit 14 obtains, from the production system 17 or the low-pressure CVD apparatus, information on the mounting position each of the product wafer groups on the boat 4 determined based on the lot feed instruction (Step S601). The film formation rate computing unit 14 which has obtained the apparatus parameters, the total gate perimeter length $L_i$, the number of wafers $N_i$ and the mounting position information of each product wafer group computes a predicted value of film formation rate based on the equation (5) (Step S602). Here, the equations (5) and (2) are preregistered in the film formation rate computing unit 14. In addition, the coefficients and constants (the coefficients $k_1$ to $k_n$, the constant K, the coefficient $A_i$, the coefficient $B_i$ and the position factor $F_{Pi}$) in the equations (2) and (5) are determined using a multiple regression analysis for example and are also preregistered in the film formation rate computing unit 14.

The predicted value of film formation rate computed by the film formation rate computing unit 14 is input to the anomaly determination unit 16. The anomaly determination unit 16 with the predicted value input compares the input predicted value of film formation rate and the reference range, and determines whether the input predicted value of film formation rate is within the reference range (Step S603). In this embodiment, the anomaly determination unit 16 has the reference range of film formation rate tolerated in the production line preregistered. The reference range may be set for each product type. In this case, the anomaly determination unit 16 has the reference range of the film formation rate tolerated for each product type preregistered, and the film formation rate computing unit 14 inputs the product type obtained from the production system 17 to the anomaly determination unit 16 along with the predicted value of film formation rate. Then, it is determined for each product type whether the predicted value is within the reference range.

As a result of the determination, when it is determined to be outside the reference range, the anomaly determination unit 16 instructs the apparatus control unit 11 to stop the process and sends information to prohibit feeding of lots to the low-pressure CVD apparatus to the product system 17. The production system 17 which has received the instruction changes a production schedule so that product wafer groups scheduled to be carried into the low-pressure CVD apparatus will be carried into another manufacturing apparatus in the production line which can perform an equivalent process (Steps S603No and S604). On the other hand, when it is within the reference range as a result of the determination, the anomaly determination unit 16 notifies the processing condition computing unit 15 of a permission to start the next process. The processing condition computing unit 15 which has received the notification obtains the predicted value of film formation rate from the film formation rate computing unit 14, obtains a target film thickness $T_{target}$ from the production system 17 and computes a film-forming time (processing time) by the method described above. The processing condition computing unit 15 which has computed the film-forming time inputs the film-forming time to the apparatus control unit 11 together with other processing conditions (such as processing temperature) obtained from the production system 17. The apparatus control unit 11 to which the processing conditions has been input performs the film formation process according to the input processing conditions (Step S603 Yes).

As described above, this embodiment can predict the film formation rate on wafers based on data of apparatus parameters of the low-pressure CVD apparatus for each batch processing and perform the anomaly determination, and then prevent anomalous film formation process from being performed. As a result, the decrease in the manufacturing yield can be suppressed.

In the above description, while it is described a construction wherein the anomaly determination unit 16 determines whether the predicted value of film formation rate is within the reference range, the anomaly determination unit 16 may perform the anomaly determination based on the film thickness to be formed in a case where the film-forming time is fixed. In this case, the film formation rate computing unit 14 multiplies the predetermined fixed film-forming time to the computed predicted value of film formation rate to predict a film thickness to be formed. In addition, the anomaly determination unit 16 has the reference range of tolerated film thickness for each product type preregistered, and then the anomaly determination unit 16 determines whether the predicted film thickness is within the reference range.

Moreover, in the low-pressure CVD apparatus, film formation processes under different processing conditions (kind of process gas or film-forming temperature) may be performed. In this case, the film formation rate computing unit 14 has prediction formulas (the coefficients and constants in the equations (2) and (5)) registered for each processing condition, and a prediction formula used is selected according to the processing condition to be performed in the low-pressure CVD apparatus.

Furthermore, while a representative value (average) is used as the actually-measured value of film formation rate in order to compute the coefficients and constants in the equations (2) and (5) for simplification in the above description, the tube height direction may be divided into multiple regions and a representative value (average) computed for each region may be used to compute the coefficients and constants in the equations (2) and (5). In this case, the equations (2) and (5) can be obtained for each region and are registered to the film formation rate computing unit 14. In addition, the film formation rate computing unit 14 selects a prediction formula used according to the mounting position information of product wafers. In addition, in this case, the processing time can be computed, for example, by dividing the film thickness to be formed by the average of predicted values of film formation rate computed for individual regions. As described above, in dividing into multiple regions, while it is practical that each region includes multiple wafer mounting positions on the boat, dividing into regions having only one wafer mounting position on the boat is not excluded.

Second Embodiment

Figure 7:
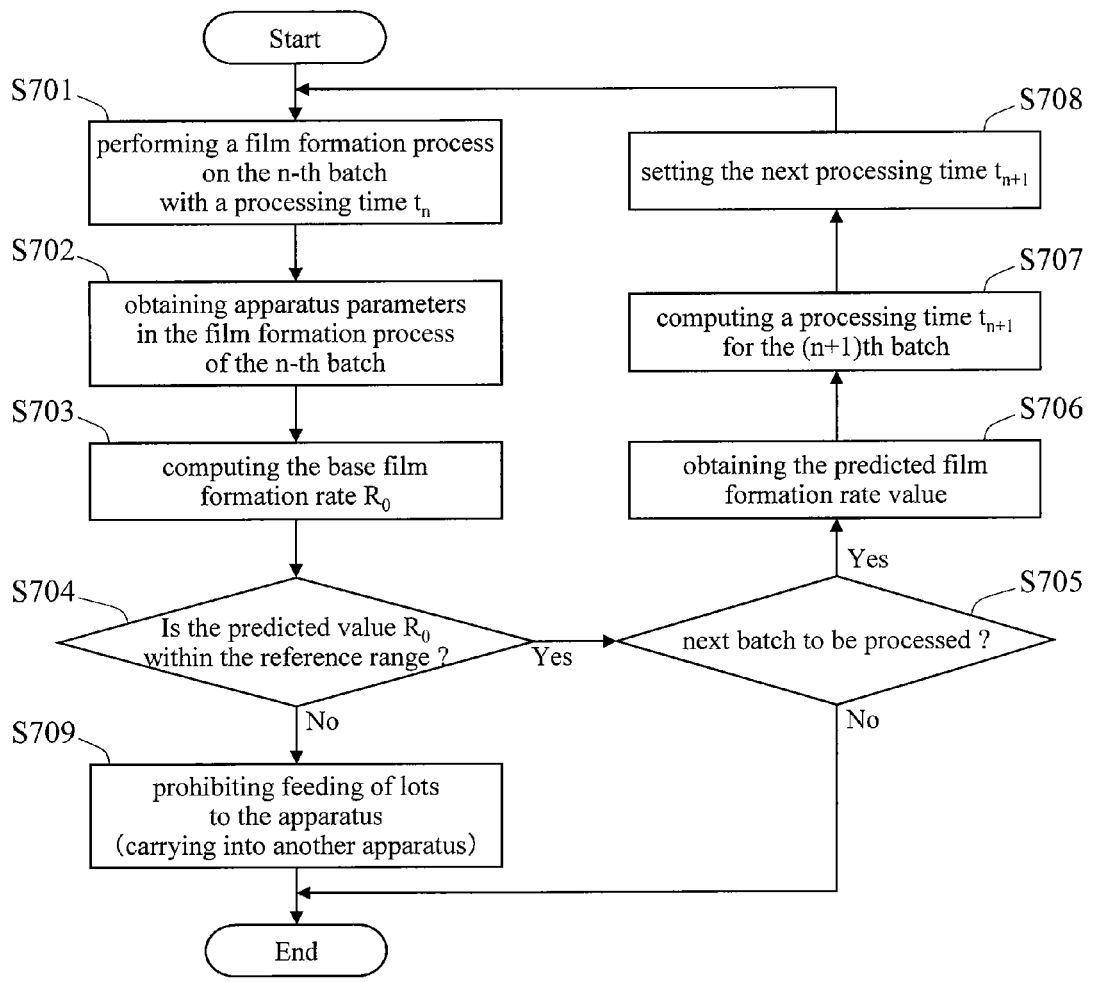
FIG. 7 is a flowchart showing a film thickness control processing in a second embodiment relating to the present invention.

Next, referring to FIGS. 1, 2 and 7, a second embodiment relating to the present invention is explained. Because a construction of the low-pressure CVD apparatus of this embodiment is similar to that of the low-pressure CVD apparatus explained in the first embodiment, its detailed explanation is omitted here.

FIG. 7 is a flowchart showing a processing to control the film thickness using the base film formation rate $R_0$ obtained by the equation (2) performed in the low-pressure CVD apparatus of this embodiment (see FIG. 1 and FIG. 2). The film thickness control processing is applied to cases wherein film formation processes under the same processing condition are performed sequentially. Therefore, the film formation control processing is started when sequential film formation processes under the same processing condition are started.

When the film thickness control processing is started, first, it stands by at least until one film formation process is complete. Then, when the film formation process is complete, the following processes are performed before the next film formation process is started. Hereafter, the film thickness control processing when the film formation process on the n-th batch wafer group is complete is explained. Here, the film formation process on the n-th batch wafer group is performed for a film-forming time $t_n$ (Step S701).

When the film formation process on the n-th batch wafer group is complete, the film formation rate computing unit 14 obtains the apparatus parameters of the low-pressure CVD apparatus in the film formation process of the n-th batch from the apparatus control unit 11 via the data collection unit 13 (Step S702). Next, the film formation rate computing unit 14 computes the base film formation rate $R_0$ using the apparatus parameters obtained from the data collection unit 13 and the equation (2) (Step S703). Here, the equation (2) expressing the base film formation rate $R_0$ is pre-registered in the film formation rate computing unit 14. In addition, the coefficients and constants (coefficients $k_1$ to $k_n$ and constant K) in the equation (2) determined by a multiple regression analysis for example employing, as the actually-measured value of film formation rate, a value representing the batch such as a measured value of a representative wafer or an average of measured values of bare wafers are pre-registered in the film formation rate computing unit 14. Hereafter, the base film formation rate $R_0$ computed in such a way is simply referred to as the predicted value $R_0$.

The predicted value $R_0$ computed by the film formation rate computing unit 14 is input to the anomaly determination unit 16. The anomaly determination unit 16 to which the predicted value $R_0$ is input compares the input predicted value $R_0$ and a predetermined reference range and determines whether the input predicted value $R_0$ is within the reference range (Step S704). Here, the reference range for predicted value $R_0$ tolerated in the production line is pre-registered in the anomaly determination unit 16. As described above, the base film formation rate is the film formation rate when a film formation process is performed on bare wafers in the full-batch state. Therefore, the base film formation rate does not depend on processing of products, but only the variation of the apparatus condition of the low-pressure CVD apparatus is reflected. In other words, when the base film formation rate has become unusually large or unusually small, it can be regarded that a certain anomaly has occurred to the film-forming apparatus. Therefore, by determining whether the base film formation rate is within the reference range, anomalies of the low-pressure CVD apparatus can be detected.

As a result of the determination, when the predicted value $R_0$ is outside the reference range, the anomaly determination unit 16 sends information prohibiting feeding of lots to the low-pressure CVD apparatus to the production system 17. The production system 17 which has received the instruction changes a production schedule so that products scheduled to be carried into the low-pressure CVD apparatus will be carried into another manufacturing apparatus in the production line which can perform an equivalent process (Steps S704 No and S709). On the other hand, when the predicted value $R_0$ is within the reference range as a result of the determination, the anomaly determination unit 16 checks whether the next processing batch exists from the apparatus control unit 11 via the data collection unit 13, and when the next processing batch does not exist, the process ends as it is (Steps S704Yes and S705No).

In addition, when the next processing batch exists, the anomaly determination unit 16 notifies the processing condition computing unit 15 of a permission to start the next process. The processing condition computing unit 15 which has received the notification obtains the predicted value of film formation rate from the film formation rate computing unit 14 (Steps S705Yes and S706). This predicted value of film formation rate is identical to the predicted value of film formation rate explained in the first embodiment. The computation of the predicted value of film formation rate by the film formation rate computing unit 14 may be performed in parallel to the computation of the predicted value $R_0$, or may be performed according to a request from the processing condition computing unit 15 for example after the determination by the anomaly determination unit 16. In addition, the processing condition computing unit 15 obtains the target film thickness $T_{target}$ from the production system 17. Then, the processing condition computing unit 15 computes a film-forming time $t_{n+1}$ (processing time) in the film formation process of the next batch according to the above-mentioned method, in other words, the computation formula of (the target film thickness $T_{target}$-the initial film thickness $T_0$)/(the predicated value of film formation rate) (Step S707). The processing condition computing unit 15 which has computed the film-forming time inputs the film-forming time $t_{n+1}$ to the apparatus control unit 11 together with other processing conditions (such as processing temperature) obtained from the production system 17 (Step S708). The apparatus control unit 11 to which the processing conditions has been input performs the film formation process of the (n+1)th batch according to the input processing conditions (Step S701).

As described above, this embodiment can control the film thickness on wafers in the next batch based on data on the apparatus parameters of the low-pressure CVD apparatus for each batch process and reduce the manufacturing variation among batches. As a result, the products can be manufactured with high yield.

In the above description, while it is described a case wherein a predicted value of base film formation rate is computed using a single base film formation rate computation formula having no position dependence in the tube, as explained in the first embodiment, multiple base film formation rate computation formulas may be used, wherein the tube height direction may be divided into multiple regions, and the coefficients and the constants are computed using a representative value (average value) computed for each region. In this case, the equation (2) is obtained for each region and is registered to the film formation rate computing unit 14. In addition, in a case where multiple base film formation rate computation formulas are used, the anomaly determination unit 16 may perform the above-mentioned determination based on the predicted value $R_0$ of the base film formation rate for each region computed by the film formation rate computing unit 14, or may perform the determination based on the average of predicted values $R_0$ of the base form formation rates for the respective regions computed by the film formation rate computing unit 14.

In addition, in a case where multiple base film formation rate computation formulas are used, the film formation rate computing unit 14 can select a film formation rate prediction formula used according to the mounting position information of the product wafer group and compute the film formation rate for each region. In this case, the processing condition computing unit 15 can compute the processing time (film-forming time $t_{n+1}$) by a computation formula of (the target film thickness $T_{target}$-the initial film thickness $T_0$)/(the average of predicted values of film formation rate) for example.

Third Embodiment

Figure 8:
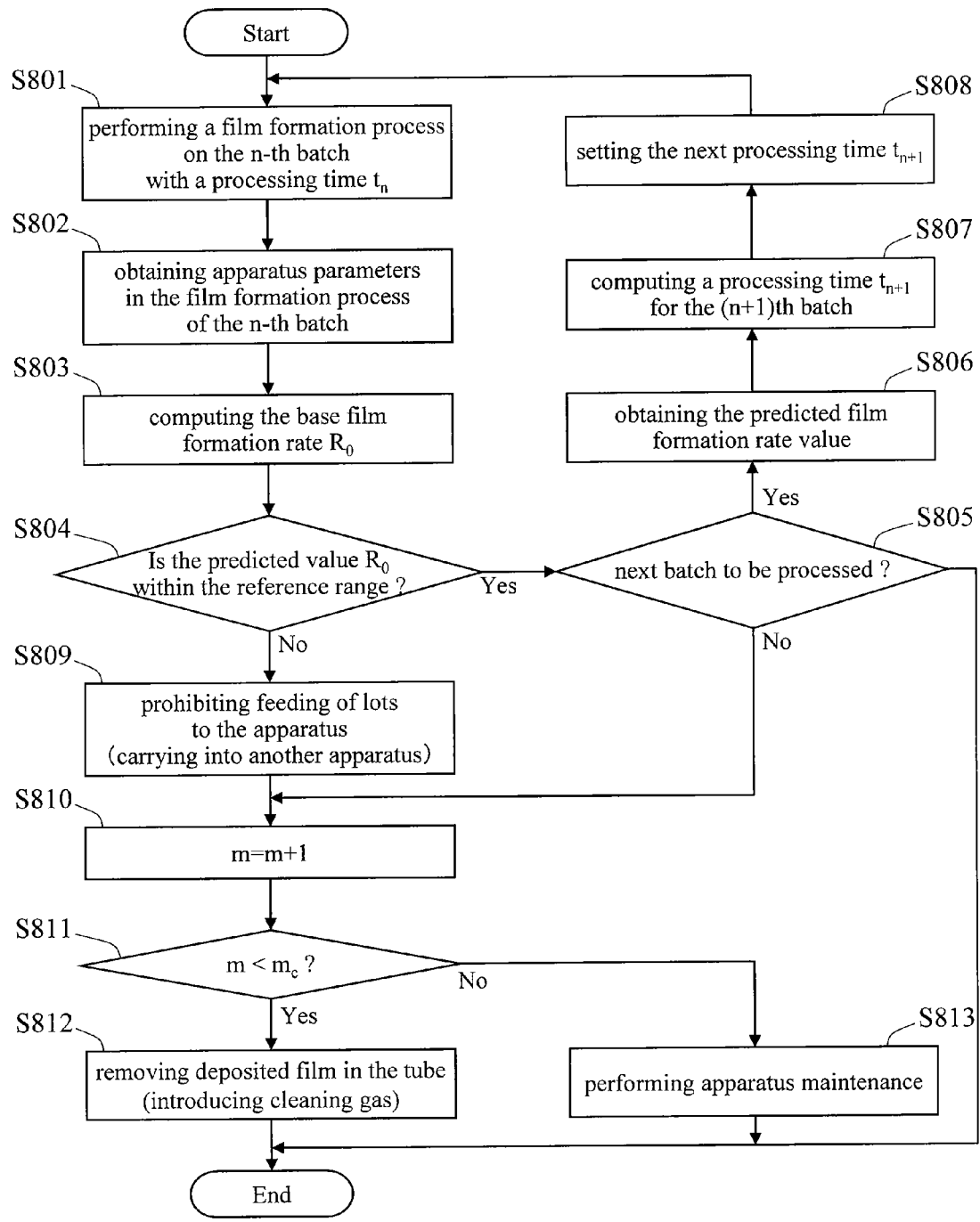
FIG. 8 is a flowchart showing a film thickness control processing including a deposited film removal processing in a third embodiment relating to the present invention.

A third embodiment relating to the present invention is explained hereafter, with referring to FIGS. 1, 2 and 8. Because a construction of the low-pressure CVD apparatus of this embodiment is also similar to that of the low-pressure CVD apparatus explained in the first embodiment, detailed explanations are omitted here. This embodiment is different from the second embodiment in that when it is determined in Step S704 of the second embodiment that the predicted value of the base film formation rate is anomalous, the film deposited in the tube is removed.

FIG. 8 is a flowchart showing a film thickness control processing performed in the low-pressure CVD apparatus of this embodiment (see FIG. 1 and FIG. 2). As in the second embodiment, the film thickness control processing is applied to cases wherein film formation processes under the same processing condition are performed sequentially. Therefore, the film formation control processing is started when sequential film formation processes under the same processing condition are started.

When the film thickness control processing is started, first, it stands by at least until one film formation process is complete. Then, when the film formation process is complete, the following processes are performed before the next film formation process is started. Hereafter, the film thickness control processing when the film formation process on the n-th batch wafer group is complete is explained. Here, the film formation process on the n-th batch wafer group is performed for a film-forming time $t_n$ (Step S801).

When the film formation process on the n-th batch wafer group is complete, the film formation rate computing unit 14 obtains the apparatus parameters of the low-pressure CVD apparatus in the film formation process of the n-th batch from the apparatus control unit 11 via the data collection unit 13 (Step S802). Next, the film formation rate computing unit 14 computes the base film formation rate $R_0$ (predicted value $R_0$) using the apparatus parameters obtained from the data collection unit 13 and the equation (2) (Step S803). Here, as in the second embodiment, the coefficients and constants (coefficients $k_1$ to $k_n$ and constant K) in the equation (2) determined by a multiple regression analysis for example employing, as the actually-measured value of film formation rate, a value representing the batch such as a measured value of a representative wafer or an average of measured values of bare wafers are pre-registered in the film formation rate computing unit 14.

The predicted value $R_0$ computed by the film formation rate computing unit 14 is input to the anomaly determination unit 16. The anomaly determination unit 16 to which the predicted value $R_0$ is input compares the input predicted value $R_0$ and a predetermined reference range and determines whether the input predicted value $R_0$ is within the reference range (Step S804). The reference range is the same as in the second embodiment.

As a result of the determination, when the predicted value $R_0$ is within the reference range, the anomaly determination unit 16 checks whether the next processing batch exists from the apparatus control unit 11 via the data collection unit 13, and when the next processing batch does not exist, the process ends as it is (Steps S804Yes and S805No). In addition, when the next batch exists, the anomaly determination unit 16 notifies the processing condition computing unit 15 as in the second embodiment, and according to the notification, the processing condition computing unit 15 obtains the predicted value of film formation rate and computes the film-forming time $t_{n+1}$ (Steps S805Yes, S806 and S807). Then, the film formation process of the (n+1)th batch is performed by the apparatus control unit 11 (Steps S808 and S801).

On the other hand, when the predicted value $R_0$ is outside the reference range as a result of the above-mentioned determination, the anomaly determination unit 16 sends information prohibiting feeding of lots to the low-pressure CVD apparatus to the production system 17. The production system 17 which has received the instruction changes a production schedule so that products scheduled to be carried into the low-pressure CVD apparatus will be carried into another manufacturing apparatus in the production line which can perform an equivalent process (Steps S804No and S809).

Further, at this time, the anomaly determination unit 16 adds "1" to a counter value m which is stored in the anomaly determination unit 16 and compares the counter value m with a predetermined reference number of times $m_C$ (Steps S810 and S811). Then, when the counter value m is smaller than the reference number of times $m_C$, the anomaly determination unit 16 instructs the apparatus control unit 11 to execute cleaning (Steps S811Yes and S812). The apparatus control unit 11 which has received the instruction introduces a cleaning gas into the reactor with no wafer mounted on the boat 4 and removes films deposited in the tube. When the cleaning is complete, the film formation process is resumed. In a case where the counter value m reaches the reference number of times $m_C$, the anomaly determination unit 16 requests the production system 17 for apparatus maintenance. Alternatively, an alarm is issued by an alarming unit (not shown) provided by the low-pressure CVD apparatus in an arbitrary manner such as sound, light and alarm display which can notify workers of the anomaly to notify the workers of the necessity of apparatus maintenance (Step S813). In a case where apparatus maintenance such as tube replacement, etc. is performed in response to the maintenance request, the counter value m is reset, and the film formation process is resumed. Besides, as the reference number of times $m_C$, a cleaning upper limit number of times which can be performed without apparatus maintenance such as tube replacement, etc. may be set.

As described above, this embodiment can perform maintenance according to the apparatus condition (condition-based maintenance) and achieve optimization of the apparatus maintenance cycle which can secure both the apparatus operation and film formation quality in addition to the effect obtained by the second embodiment.

Moreover, in this embodiment as well, multiple base film formation rate computation formula may be used wherein the tube height direction is divided into multiple regions, and the coefficients and constants are computed using a representative value (average) for each region as explained in the second embodiment.

As described above, the present invention can prevent execution of anomalous processes caused by the variation in film formation rate due to the change in the apparatus condition of a batch-type film-forming apparatus along with its use or the variation in film formation rate which occurs when processing product wafers having different total gate perimeter lengths in a same batch. In addition, even when such variations in film formation rate occur, the film thickness can be controlled to a desired value. As a result, the manufacturing yield of semiconductor devices can be improved, and the variation among batches can be reduced.

The embodiments as discussed above do not restrict the technical scope of the present invention and various modifications and applications are possible within a range which does not deviate from the technical idea of the present invention. For example, while in the second and third embodiments, the presence/absence of anomaly was determined based on whether the predicted value of base film formation rate is within a tolerated range as an especially preferred embodiment, it is also possible to determine the presence/absence of anomaly based on whether the predicted value of film formation rate computed by the equation (5) is within the tolerated range. In addition, the first embodiment and third embodiment can be combined to make a construction wherein cleaning is automatically performed in a case where the predicted film thickness is determined to be outside the tolerated range.

In addition, while explained in the embodiments were cases wherein the present invention was applied to the low-pressure CVD apparatus which introduces a process gas from the bottom of the tube, it can be appropriately applied to another low-pressure CVD apparatus having a different process gas introduction type such as a low-pressure CVD apparatus which introduces a process gas from the top of the tube, etc. In addition, the present invention is applicable to not only low-pressure CVD apparatuses but also any manufacturing apparatus which performs a film formation process on multiple wafers set up in a processing chamber under heating.

This present invention has effects of controlling the film thickness on wafers, reducing the manufacturing variation, and improving the manufacturing yield, and is useful as a semiconductor device manufacturing method and a semiconductor device manufacturing apparatus.

What is claimed is:

1. A semiconductor device manufacturing method comprising a film formation process to form a film on a plurality of wafers placed in a processing chamber while heated by a heat source outside the processing chamber through a wall of the processing chamber, the film formation process comprising the steps of:
   computing a predicted film formation rate value based on a prediction formula obtained in advance which expresses a relationship between an amount of thermal energy reaching the wafer, the amount varying depending on a deposited film thickness on an inner wall of the processing chamber, and a film formation rate on the wafer as a function including multiple apparatus parameters, the apparatus parameters being obtained during a previously-performed film formation process;
   computing, based on the computed predicted film formation rate value and a predetermined target film thickness, a processing time required for an amount of film formed on the wafer to reach the predetermined target film thickness; and
   forming the film on the plurality of wafers according to the computed processing time.

2. A semiconductor device manufacturing method comprising a film formation process to form a film on a plurality of wafers placed in a processing chamber while heated by a heat source outside the processing chamber through a wall of the processing chamber, the film formation process comprising the steps of:
   computing a predicted film formation rate value based on a prediction formula obtained in advance which expresses a relationship between an amount of thermal energy reaching the wafer, the amount varying depending on a deposited film thickness on an inner wall of the processing chamber, and a film formation rate on the wafer as a function including multiple apparatus parameters, the apparatus parameters being obtained during a previously-performed film formation process;

computing, based on the computed predicted film formation rate value and a scheduled processing time, an amount of film formed on the wafer after the scheduled processing time has passed;

determining whether the computed formed film amount is within a predetermined range; and forming the film on the plurality of wafers when it is determined that the computed formed film amount is within the predetermined range.

3. A semiconductor device manufacturing method according to claim 1, further comprising a step of determining whether the computed predicted film formation rate value is within a predetermined range, and wherein the step of forming the film is performed when it is determined that the computed predicted film formation rate value is within the predetermined range.

4. A semiconductor device manufacturing method according to claim 1, wherein the prediction formula is obtained based on one film formation rate representing the film formation rates on all the plurality of wafers in the processing chamber.

5. A semiconductor device manufacturing method according to claim 2, wherein the prediction formula is obtained based on one film formation rate representing the film formation rates on all the plurality of wafers in the processing chamber.

6. A semiconductor device manufacturing method according to claim 1, wherein the prediction formula includes a correction term to express an amount of variation in the film formation rate which depends on an area on which the film is formed on the plurality of wafers placed in the processing chamber.

7. A semiconductor device manufacturing method according to claim 2, wherein the prediction formula includes a correction term to express an amount of variation in the film formation rate which depends on an area on which the film is formed on the plurality of wafers placed in the processing chamber.

8. A semiconductor device manufacturing method according to claim 6, wherein the correction term includes a perimeter length of an element pattern formed on each of the plurality of wafers.

9. A semiconductor device manufacturing method according to claim 7, wherein the correction term includes a perimeter length of an element pattern formed on each of the plurality of wafers.

10. A semiconductor device manufacturing method according to claim 1, wherein the prediction formula includes a correction term to express an amount of variation in the film formation rate which depends on a wafer mounting position in the processing chamber.

11. A semiconductor device manufacturing method according to claim 2, wherein the prediction formula includes a correction term to express an amount of variation in the film formation rate which depends on a wafer mounting position in the processing chamber.

12. A semiconductor device manufacturing method comprising a film formation process to form a film on a plurality of wafers placed in a processing chamber while heated by a heat source outside the processing chamber through a wall of the processing chamber, the film formation process comprising the steps of:

computing a predicted base film formation rate value based on a base film formation rate prediction formula which expresses a relationship between an amount of thermal energy reaching the wafer, the amount varying depending on a deposited film thickness on an inner wall of the processing chamber, and a film formation rate on the wafer as a function including multiple apparatus parameters, the apparatus parameters being obtained during a film formation process performed immediately before, the base film formation rate prediction formula being obtained in advance in a state that bare wafers are placed on all wafer mounting positions in the processing chamber;

determining whether the computed predicted base film formation rate value is within a predetermined range;

computing a predicted film formation rate value based on a film formation rate prediction formula obtained in advance which expresses a relationship between the amount of thermal energy and a film formation rate on a product wafer mounted on the wafer mounting position in the processing chamber, and based on the apparatus parameters obtained during the film formation process performed immediately before, when it is determined that the computed predicted base film formation rate value is within the predetermined range;

computing, based on the computed predicted film formation rate value and a predetermined target film thickness, a processing time required for an amount of film formed on the product wafer in the processing chamber to reach the predetermined target film thickness; and forming the film on a plurality of the product wafers in the processing chamber according to the computed processing time.

13. A semiconductor device manufacturing method according to claim 2, wherein the film deposited on the inner wall is removed by introducing a cleaning gas into the processing chamber with no wafer when it is determined that the computed formed film amount is outside the predetermined range in the determination.

14. A semiconductor device manufacturing method according to claim 3, wherein the film deposited on the inner wall is removed by introducing a cleaning gas into the processing chamber with no wafer when it is determined that the computed predicted film formation rate value is outside the predetermined range in the determination.

15. A semiconductor device manufacturing method according to claim 12, wherein the film deposited on the inner wall is removed by introducing a cleaning gas into the processing chamber with no wafer when it is determined that the computed predicted base film formation rate value is outside the predetermined range in the determination.

16. A semiconductor device manufacturing apparatus forming a film on a plurality of wafers placed in a processing chamber while heated by a heat source outside the processing chamber through a wall of the processing chamber, comprising:

a film formation rate computing unit configured to compute a predicted film formation rate value by substituting apparatus parameters into a prediction formula preregistered which expresses a relationship between an amount of thermal energy reaching the wafer, the amount varying depending on a deposited film thickness on an inner wall of the processing chamber, and a film formation rate on the wafer as a function including multiple apparatus parameters, the apparatus parameters being obtained during a previously-performed film formation process;

a data collection unit configured to obtain the apparatus parameters during a film formation process;

a processing condition computing unit configured to compute, based on the predicted film formation rate value computed by the film formation rate computing unit and a predetermined target film thickness, a processing time required for an amount of film formed on the wafer to reach the predetermined target film thickness; and a control unit configured to perform a film formation process for the plurality of wafers according to the processing time computed by the processing condition computing unit.

17. A semiconductor device manufacturing apparatus according to claim 16, further comprising an anomaly determination unit configured to determine whether the predicted film formation rate value computed by the film formation rate computing unit is within a predetermined range, and wherein the control unit performs the film formation process when the anomaly determination unit determines that the predicted film formation rate value is within the predetermined range.

18. A semiconductor device manufacturing apparatus forming a film on a plurality of wafers placed in a processing chamber while heated by a heat source outside the processing chamber through a wall of the processing chamber, comprising:

a film formation rate computing unit configured to compute a predicted film formation rate value by substituting apparatus parameters into a prediction formula preregistered which expresses a relationship between an amount of thermal energy reaching the wafer, the amount varying depending on a deposited film thickness on an inner wall of the processing chamber, and a film formation rate on the wafer as a function including multiple apparatus parameters, the apparatus parameters being obtained during a previously-performed film formation process, and to compute, based on the predicted film formation rate value and a scheduled processing time, an amount of film formed on the wafer after the scheduled processing time has passed;

a data collection unit configured to obtain the apparatus parameters during a film formation process;

an anomaly determination unit configured to determine whether the formed film amount computed by the film formation rate computing unit is within a predetermined range; and a control unit configured to perform a film formation process for the plurality of wafers when the anomaly determination unit determines that the formed film amount is within a predetermined range.

* * * * *